(12) United States Patent
Xian et al.

(10) Patent No.: US 11,810,922 B2
(45) Date of Patent: Nov. 7, 2023

(54) ARRAY SUBSTRATE AND DISPLAY DEVICE

(71) Applicant: BOE TECHNOLOGY GROUP CO., LTD., Beijing (CN)

(72) Inventors: Jianbo Xian, Beijing (CN); Hongfei Cheng, Beijing (CN); Yong Qiao, Beijing (CN); Yongda Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 303 days.

(21) Appl. No.: 17/228,676

(22) Filed: Apr. 12, 2021

(65) Prior Publication Data

US 2021/0233936 A1 Jul. 29, 2021

Related U.S. Application Data

(63) Continuation of application No. 16/000,384, filed on Jun. 5, 2018, now Pat. No. 11,004,873.

(30) Foreign Application Priority Data

Aug. 21, 2017 (CN) .......................... 201710718273.3

(51) Int. Cl.
*H01L 27/12* (2006.01)
*H01L 29/786* (2006.01)
(Continued)

(52) U.S. Cl.
CPC .......... *H01L 27/124* (2013.01); *G02F 1/1368* (2013.01); *H01L 29/41733* (2013.01); *H01L 29/42384* (2013.01); *H01L 29/786* (2013.01)

(58) Field of Classification Search
CPC ............. H01L 27/124; H01L 29/41733; G02F 1/136286

See application file for complete search history.

(56) References Cited

U.S. PATENT DOCUMENTS

| 5,978,058 | A | 11/1999 | Sung |
| 7,928,937 | B2 | 4/2011 | Ozaki |

(Continued)

FOREIGN PATENT DOCUMENTS

| CN | 1691119 A | 11/2005 |
| CN | 101738805 A | 6/2010 |

(Continued)

OTHER PUBLICATIONS

Office Action issued in corresponding Chinese Patent Application No. 201710718273.3, dated Jun. 25, 2019.

(Continued)

*Primary Examiner* — Peter M Albrecht
(74) *Attorney, Agent, or Firm* — McDermott Will & Emery LLP

(57) ABSTRACT

An array substrate and a display device are disclosed. The array substrate includes: a base substrate; and a first electrically conductive layer and a second electrically conductive layer on the base substrate, wherein the base substrate is provided with at least one thin film transistor, each of the at least one thin film transistor includes a gate electrode disposed in the first electrically conductive layer, and a source electrode and a drain electrode disposed in the second electrically conductive layer, and wherein the drain electrode has a comb shape and includes a plurality of drain electrode sub-portions extending parallel to one another, and the source electrode has a comb shape and includes a plurality of source electrode sub-portions extending parallel to one another, and wherein at least one of the drain electrode and the source electrode includes an electrode body and an extending portion, the electrode body overlapping with the gate electrode, and the extending portion overlapping with a portion of the first electrically conductive layer other than the gate electrode.

18 Claims, 5 Drawing Sheets

(51) Int. Cl.
  *H01L 29/417* (2006.01)
  *H01L 29/423* (2006.01)
  *G02F 1/1368* (2006.01)

(56) References Cited

U.S. PATENT DOCUMENTS

| | | |
|---|---|---|
| 9,780,177 B2 | 10/2017 | Hwang et al. |
| 2003/0058450 A1 | 3/2003 | Mosley et al. |
| 2007/0103609 A1 | 5/2007 | Kang et al. |
| 2007/0132902 A1 | 6/2007 | Yao |
| 2008/0111934 A1 | 5/2008 | Wu et al. |
| 2009/0015775 A1 | 1/2009 | Mori et al. |
| 2009/0158062 A1 | 6/2009 | Delmotte et al. |
| 2010/0320473 A1 | 12/2010 | Liu |
| 2014/0191238 A1 | 7/2014 | Hwang et al. |
| 2014/0239428 A1 | 8/2014 | Pueschner et al. |
| 2016/0197098 A1 | 7/2016 | Xian et al. |
| 2016/0291368 A1 | 10/2016 | Kim et al. |
| 2018/0011357 A1* | 1/2018 | Lee .................. H01L 29/41733 |

FOREIGN PATENT DOCUMENTS

| | | | |
|---|---|---|---|
| CN | 103915448 A | 7/2014 | |
| CN | 104393004 A | 3/2015 | |
| KR | 10-2004-0005256 A | 1/2004 | |
| KR | 20040005256 A * | 1/2004 | ....... G02F 1/136286 |
| KR | 10-2012-0114108 A | 10/2012 | |

OTHER PUBLICATIONS

Non-Final Office Action issued in U.S. Appl. No. 16/000,384, dated Jun. 26, 2019.
Final Office Action issued in U.S. Appl. No. 16/000,384, dated Jan. 23, 2020.
Non-Final Office Action issued in U.S. Appl. No. 16/000,384, dated Aug. 20, 2020.

\* cited by examiner

ARRAY SUBSTRATE AND DISPLAY DEVICE

CROSS-REFERENCE TO RELATED APPLICATION

This application is a continuation application of U.S. application Ser. No. 16/000,384, filed on Jun. 5, 2018, which published as U. S. P.A.P. 2019/0057979 A1, on Feb. 21, 2019, and which claims the benefit of Chinese Patent Application No. 201710718273.3 filed on Aug. 21, 2017 in the State Intellectual Property Office of China, the whole disclosure of which is incorporated herein by reference.

TECHNICAL FIELD

The present disclosure relates to display technology, and more specifically, to an array substrate and a display device.

BACKGROUND

In an active matrix driving-type display device, pixels are usually driven by means of thin film transistors (TFTs). Therefore, in the active matrix driving-type display device, a large number of TFTs need to be fabricated.

SUMMARY

An embodiment of the present disclosure provides an array substrate including: a base substrate; and a first electrically conductive layer and a second electrically conductive layer on the base substrate, wherein the base substrate is provided with at least one TFT, each of the at least one TFT includes a gate electrode disposed in the first electrically conductive layer, and a source electrode and a drain electrode disposed in the second electrically conductive layer, and wherein the drain electrode has a comb shape and includes a plurality of drain electrode sub-portions extending parallel to one another, and the source electrode has a comb shape and includes a plurality of source electrode sub-portions extending parallel to one another, and wherein at least one of the drain electrode and the source electrode includes an electrode body and an extending portion, the electrode body overlapping with the gate electrode, and the extending portion overlapping with a portion of the first electrically conductive layer other than the gate electrode.

In some embodiments, the plurality of drain electrode sub-portions and the plurality of source electrode sub-portions are alternately arranged in a first direction parallel to the base substrate.

In some embodiments, the plurality of drain electrode sub-portions includes a first drain electrode sub-portion and a second drain electrode sub-portion; the first drain electrode sub-portion includes a first electrode body and a first extending portion, and the second drain electrode sub-portion includes a second electrode body and a second extending portion; each of the first electrode body and the second electrode body overlaps with the gate electrode, each of the first extending portion and the second extending portion overlaps with the portion of the first electrically conductive layer other than the gate electrode, and the first extending portion and the second extending portion extend in a same direction.

In some embodiments, the plurality of source electrode sub-portions include a first source electrode sub-portion, a second source electrode sub-portion, and a third source electrode sub-portion, the first source electrode sub-portion, the second source electrode sub-portion, and the third source electrode sub-portion overlap with the gate electrode and extend in the same direction as the first extending portion and the second extending portion.

In some embodiments, the drain electrode includes a drain electrode connection part electrically connecting the plurality of drain electrode sub-portions, and the source electrode includes a source electrode connection part electrically connecting the plurality of source electrode sub-portions.

In some embodiments, the drain electrode connection part is connected to the plurality of drain electrode sub-portions at a right angle.

In some embodiments, at least a portion of an orthogonal projection of the drain electrode connection part on the base substrate is located between an orthogonal projection of the gate electrode on the base substrate and an orthogonal projection of the portion of the first electrically conductive layer other than the gate electrode on the base substrate.

In some embodiments, the array substrate further includes: a lead-out electrode layer electrically connected to the drain electrode through a via hole, wherein an orthogonal projection of the via hole on the base substrate is located between the orthogonal projection of the gate electrode on the base substrate and the orthogonal projection of the portion of the first electrically conductive layer other than the gate electrode on the base substrate.

In some embodiments, the lead-out electrode layer extends in a same direction as the drain electrode connection part.

In some embodiments, the first electrically conductive layer further includes a gate line connected to the gate electrode; and wherein each of the first extending portion and the second extending portion overlaps with the gate line.

In some embodiments, the first extending portion and the first electrode body are in a same straight line and the first extending portion is perpendicular to the gate line; and the second extending portion and the second electrode body are in a same straight line and the second extending portion is perpendicular to the gate line.

In some embodiments, an area of a region where the first extending portion overlaps with the portion of the first electrically conductive layer other than the gate electrode is smaller than or equal to an area of a region where the first electrode body overlaps with the gate electrode; and an area of a region where the second extending portion overlaps with the portion of the first electrically conductive layer other than the gate electrode is smaller than or equal to an area of a region where the second electrode body overlaps with the gate electrode.

In some embodiments, a sum of an overlap capacitance between the first electrode body and the gate electrode and an overlap capacitance between the first extending portion and the portion of the first electrically conductive layer other than the gate electrode is a constant value; or a sum of an overlap capacitance between the second electrode body and the gate electrode and an overlap capacitance between the second extending portion and the portion of the first electrically conductive layer other than the gate electrode is a constant value.

Another embodiment of the present disclosure also provides an array substrate including: a base substrate; and a first electrically conductive layer and a second electrically conductive layer on the base substrate, wherein the base substrate is provided with at least one TFT, each of the at least one TFT includes a gate electrode disposed in the first electrically conductive layer, and a source electrode and a drain electrode disposed in the second electrically conductive layer, the drain electrode includes a first drain electrode sub-portion and a second drain electrode sub-portion extending parallel to each other and a drain electrode connection part electrically connecting the first drain electrode sub-portion and the second drain electrode sub-portion, the drain electrode connection part is disposed at a right angle to either of the first drain electrode sub-portion and the second drain electrode sub-portion, and wherein at least one of the drain electrode and the source electrode includes an electrode body and an extending portion, the electrode body overlapping with the gate electrode, the extending portion overlapping with the portion of the first electrically conductive layer other than the gate electrode, and the first drain electrode sub-portion is perpendicular to the gate line.

Another embodiment of the present disclosure also provides an array substrate including: a base substrate; and a first electrically conductive layer and a second electrically conductive layer on the base substrate, wherein the base substrate is provided with at least one TFT, each of the at least one TFT includes a gate electrode disposed in the first electrically conductive layer, and a source electrode and a drain electrode disposed in the second electrically conductive layer; wherein the first electrically conductive layer further includes a gate line electrically connected to the gate electrode and at least one protrusion projecting from the gate line, the protrusion is separated from the gate electrode, and at least one of the drain electrode and the source electrode overlaps with each of the gate electrode and the protrusion, and wherein the protrusion and the gate electrode project from the gate line in a same direction, and a length by which the protrusion projects from the gate line is greater than a length by which the gate electrode projects from the gate line.

In some embodiments, the array substrate further includes: a lead-out electrode layer electrically connected to the drain electrode through a via hole, wherein an orthogonal projection of the via hole on the base substrate is located between an orthogonal projection of the gate electrode on the base substrate and an orthogonal projection of the protrusion on the base substrate.

In some embodiments, the drain electrode includes a first drain electrode sub-portion and a second drain electrode sub-portion extending parallel to each other and a drain electrode connection part electrically connecting the first drain electrode sub-portion and the second drain electrode sub-portion, the drain electrode connection part extends in a same direction as the lead-out electrode layer.

An embodiment of the present disclosure also provides a display device including the array substrate as described above.

It is understood that other embodiments and configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

DETAILED DESCRIPTION

Figure 1:
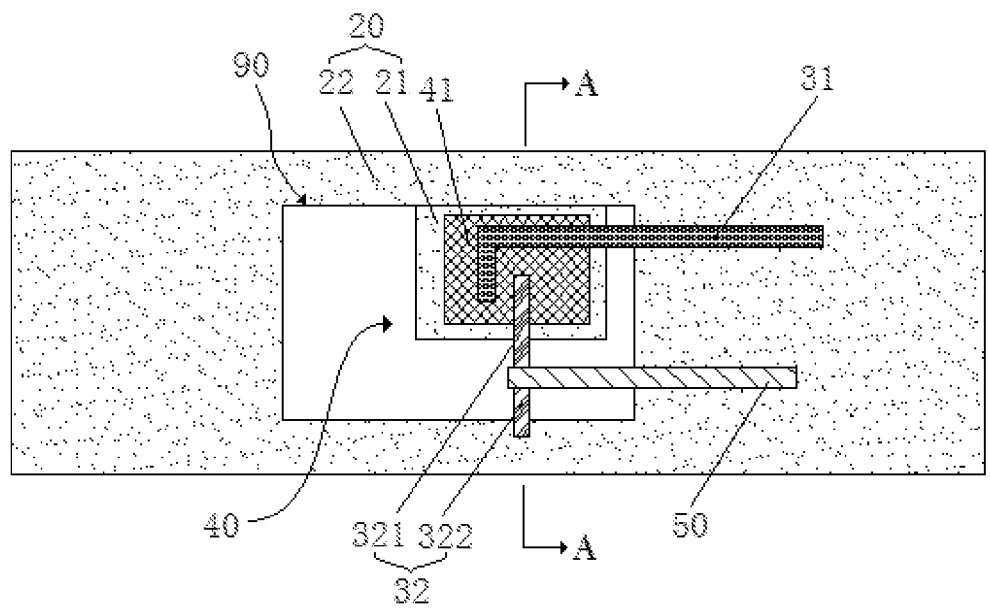
FIG. 1 is a top view showing a structure of an array substrate provided by an embodiment of the present disclosure.

To make the objectives, technical solutions, and advantages of the present disclosure clearer, the present disclosure is further described below in detail with reference to specific embodiments and the accompanying drawings.

It is noted that all the expressions including "first" and "second" in the embodiments of the present disclosure are intended to distinguish between two different entities with a same name or two different parameters with a same name. It can be seen that the expressions of "first" and "second" are provided for the convenience of description only, and thus should not be understood as a limitation on the embodiments of the present disclosure. The same will apply to all the following embodiments and thus it will not be repeated.

The inventors have found that in the process of fabricating the TFT in the related art, the position of a drain electrode (or a source electrode) in the TFT may have an offset due to the deviations of the process, the apparatus and the like, so that the area of the region where the drain electrode (or the source electrode) overlaps with a gate line may fluctuate, affecting the stability of the TFT.

The embodiments of the present disclosure provide an array substrate capable of reducing, preventing, or solving the problem that the overlapping area of the drain electrode and the gate layer fluctuates. As shown in the drawings, FIG. 1 is a schematic top view of an array substrate provided in an embodiment of the present disclosure (in order to illustrate the improved structure more clearly, some structures such as a base substrate 10, a gate insulating layer 60 and a protection layer 70, etc. are omitted in FIG. 1), and FIG. 2 is a cross-sectional view of the array substrate provided by the embodiment shown in FIG. 1 taken along line A-A.

The array substrate includes a base substrate 10, and a first electrically conductive layer 20 and a second electrically conductive layer disposed on the base substrate 10. At least one TFT (Thin Film Transistor) 40 is disposed on the base substrate 10. Each of the at least one TFT 40 includes a gate electrode 21 disposed in the first electrically conductive layer 20 and a source electrode 31 and a drain electrode 32 disposed in the second electrically conductive layer. The drain electrode 32 of the TFT 40 includes an electrode body 321 and an extending portion 322. The electrode body 321 overlaps with the gate electrode 21 of the TFT 40. The extending portion 322 overlaps with the first electrically conductive layer 20 in the non-TFT region. That is, the extending portion 322 overlaps with a portion of the first electrically conductive layer 20 other than the gate electrode 21. Thus, in the case where the area of the region where the electrode body 321 overlaps with the gate electrode 21 is decreased or increased, the overlapping portion of the extending portion 322 and the first electrically conductive layer 20 may be increased or decreased accordingly, thereby compensating for the offset of the drain electrode.

Figure 2:
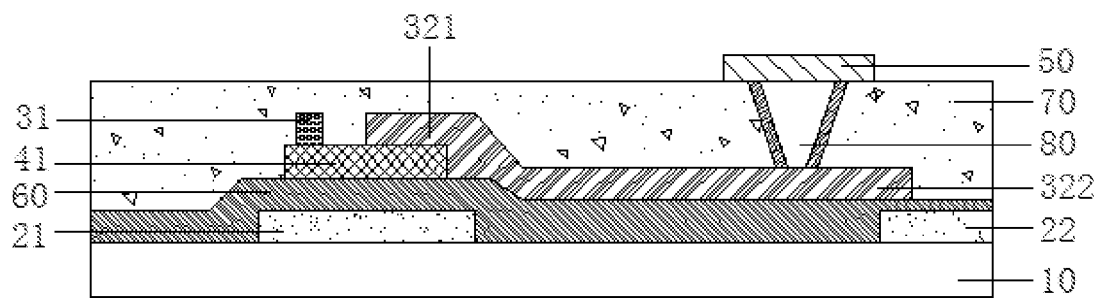
FIG. 2 is a cross sectional view of the array substrate provided in FIG. 1 taken along line A-A.

It can be seen from the above embodiments that in the array substrate provided by the embodiments of the present disclosure, the drain electrode of the TFT is provided with an extending portion which overlaps with the first electrically conductive layer 20 in the non-TFT region, so that in the case where the overlapping portion of the electrode body 321 and the gate electrode 21 is decreased or increased (for example, fluctuates up and down in the direction in the paper, in the example of FIG. 1), the overlapping portion of the extending portion and the first electrically conductive layer is increased or decreased accordingly. As a result, the overlap capacitance between the drain electrode of the TFT and the first electrically conductive layer may have a reduced deviation which is resulted from the fabrication process, thereby ensuring the stability of the TFT on the array substrate. It is appreciated that the non-TFT region refers to the region without any TFTs that may operate independently. That is, in the non-TFT region there are no independently operable TFTs.

The principle of this embodiment is briefly described below. The area of the region where the drain electrode overlaps with the first electrically conductive layer is substantially constant, even if there is a deviation in the TFT fabrication process and the position of the drain electrode thus have an offset, since the area of the overlapping region of the drain electrode (e.g., electrode body) and the first electrically conductive layer is increased/decreased by substantially the same amount as the amount by which the area of the overlapping region of the extending portion and the first electrically conductive layer is decreased/increased. As an example, the width of the first electrically conductive layer may range from 3 µm to 30 µm, and the overlapping portion of them may have a width ranging from 1 µm to 10 µm.

In order to realize a narrow frame, the array substrate is usually designed to use GOA (Gate driver on Array) technology. However, the GOA design needs more TFTs, and the output TFT of the GOA design needs high drive capability, better stability, and generally larger size. Therefore, optionally, applying the improved TFT of the array substrate in the foregoing embodiment to the array substrate with GOA design may lead to a better stability of the TFT in the GOA region.

In an example, referring to FIG. 1 and FIG. 2, the first electrically conductive layer 20 further includes a gate line 22 connected to the gate electrode 21 of the TFT 40. The extending portion 322 overlaps with the gate line 22 in the non-TFT region. The length of the overlapping portion of the extending portion 322 and the gate line 22 in the widthwise direction of the gate line (for example, as shown in FIG. 1, this length is the length of the part of the extending portion 322 extending into the gate line 22) are not greater than one third of the width of the gate line 22 at the overlapping region (the width of the gate line 22 as referred to herein refers to the width of the gate line 22 at the position where the gate line 22 overlaps with the extending portion 322 and the width may vary as the overlapping position changes). By defining the length of the overlapping portion of the extending portion 322 and the gate line 22, the variation of the area of the overlapping portion of the extending portion 322 and the gate line 22 may be consistent with the variation of the area of the overlapping portion of the electrode body 321 and the gate electrode 21.

Figure 9:
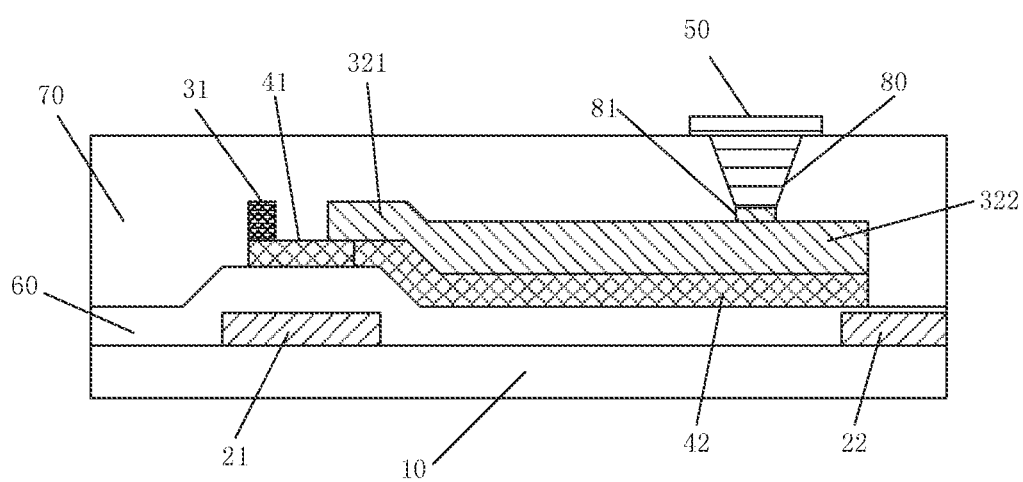
FIG. 9 is a cross sectional view showing a structure of an array substrate provided by another embodiment of the present disclosure

Referring to FIG. 1 and FIG. 2, a gate insulating layer 60 and an active layer 41 are further disposed between the gate electrode 21 and the electrode body 321. For example, an active material layer 42 (i.e., a layer having the same material as the active layer) (see FIG. 9) is also disposed below the extending portion 322, so that the height of the extending portion 322 may be kept consistent with the height of the electrode body 321, thereby further improving the stability of the overlap capacitance between the drain electrode and the first electrically conductive layer. In addition, it is also possible to ensure that the capacitance formed between the extending portion 322 and the gate line 22 may compensate for the variation of the capacitance between the electrode body 321 and the gate electrode 21. Apparently, the embodiment of the present disclosure is not limited thereto. For example, the active material layer 42 may be absent below the extending portion 322 (see FIG. 2).

As an example, referring to FIG. 1 and FIG. 2, a lead-out electrode layer 50 is electrically connected to the drain electrode 32 through a via hole 80, and the via hole 80 is located between the overlapping portion of the electrode body 321 and the gate electrode 21 and the overlapping portion of the extending portion 322 and the first electrically conductive layer 20. In an example, the length of the electrode body 321 is equal to the length of the extending portion 322. That is, the distance from the via hole 80 to the distal end of the electrode body 321 (the end of the electrode body 321 that is far away from the via hole 80) is equal to the distance from the via hole 80 to the distal end of the extending portion 322 of the drain electrode (the end of the extending portion 322 that is far away from the via hole 80). In this way, advantageously, even if the electrode body 321 offsets from the gate electrode 21 and the deviation may be transferred to the lead-out electrode layer 50 at the via hole 80, the overlap capacitance between the extending portion 322 and the gate line 22 in the opposite direction may rapidly be compensated so as to quickly counteract the deviation between the electrode body 321 and the gate electrode 21. Therefore, the lead-out electrode layer 50 at the via hole 80 is less affected by the fluctuation of the overlapping area between the electrode body 321 and the first electrically conductive layer.

As an example, the extending portion 322 and the electrode body 321 are in the same straight line, and the extending portion 322 is perpendicular to the gate line in the first electrically conductive layer 20, so as to simplify the manufacturing process. In particular, when the improved TFT structure is located in the GOA region, it may fully utilize the layout space and realize a narrow frame. As an example, the extending direction of the source electrode 31 of the TFT of the GOA is the same as the extending direction of the first electrically conductive layer, which may reduce the occupied space in comparison with the case that they are not in the same direction, and is advantageous for achieving a narrow frame.

As an example, the overlapping area between the extending portion 322 and the first electrically conductive layer 20 is slightly smaller than or equal to the overlapping area of the electrode body 321 and the gate electrode 21, so that the performance of the TFT itself may be ensured with the variation of the overlap capacitance reduced. In particular, in the case where there is no active material layer 42 between the extending portion 322 and the gate line layer, as an example, the overlapping area between the extending portion 322 and the portion of the first electrically conductive layer 20 other than the gate electrode 21 is slightly smaller than the overlapping area between the electrode body 321 and the gate electrode 21. As an example, in the case where the end of the electrode body 321 (the end close to the source electrode) is curved, the end of the extending portion 322 (the end close to the gate line) is also curved so as to ensure the consistency between them.

As an example, the end of the electrode body 321 that is close to the source electrode is slightly smaller than the end of the extending portion. Advantageously, it is possible to ensure that the end of the extending portion 322 may be easily overlapped with the first electrically conductive layer, irrespective of the larger or smaller fluctuation of the overlapping area between the electrode body 321 and the gate electrode 21.

As an example, the sum of the overlap capacitance between the electrode body 321 and the gate electrode 21 and the overlap capacitance between the extending portion 322 and the portion of the first electrically conductive layer 20 other than the gate electrode (for example, a gate line) is a constant value so as to minimize the deviation of the overlap capacitance between the drain electrode of the TFT and the first electrically conductive layer 20 due to the process, thereby ensuring a better stability of the TFT on the array substrate. That is, the electrode body 321 overlaps with the gate electrode 21 of the TFT 40 in the TFT region to form a first capacitance, and the extending portion 322 overlaps with the first electrically conductive layer 20 in the non-TFT region to form a second capacitance. The sum of the first capacitance and the second capacitance is a constant value. Even in the case where the overlapping portion of the electrode body 321 and the gate electrode 21 is decreased or increased, the overlapping portion of the extending portion 322 and the first electrically conductive layer 20 may be increased or decreased accordingly.

As an example, in the case where the active material layer 42 is disposed below the extending portion 322, the active material layer and the active layer 41 of the TFT 40 are connected to each other, so as to simplify the manufacturing process. In an example, in the case where the active material layer 42 is disposed under the extending portion 322, the source electrode is absent in the region where the extending portion 322 overlaps with the active material layer 42, so as to ensure that the extending portion 322 is only used to adjust the overlap capacitance between the drain electrode of the TFT and the first electrically conductive layer without affecting the other performance of the TFT. As an example, in the case where the lead-out electrode layer 50 is electrically connected to the drain electrode 32 through the via hole 80, a metal pad 81 is disposed under the via hole 80. For example, the metal pad 81 may be fabricated by using the first electrically conductive layer 20, and the metal pad 81 and the first electrically conductive layer may be fabricated in the same process. By means of the metal pad 81, the drain electrode 32 at the via hole 80 may be lifted to a certain extent such that the depth of the via hole 80 may be decreased, thereby reducing the problem of disconnection due to the excessive depth of the via hole 80. In the embodiment shown in FIG. 9, the active material layer 42 and the metal pad 81 are illustrated. It should be noted that in an alternative embodiment of the present disclosure, the array substrate may also include only one of the active material layer 42 and the metal pad 81.

As an example, referring to FIG. 1, a hollow region 90 is formed in the first electrically conductive layer 20. The TFT 40 is located in the hollow region 90, the gate electrode 21 is also located in the hollow region 90, and the via hole 80 is located in the hollow area 90 too. In this way, on one hand, wirings in the first electrically conductive layer 20 can be arranged more compactly, and on the other hand, the gate electrode 21 and the position where the first electrically conductive layer 20 overlaps with the extending portion 322 form a ring, with weak current or voltage difference therebetween, which is beneficial to reduce the impact of fluctuations in the overlapping area of the drain electrode 32 and the first electrically conductive layer 20 on the lead-out electrode layer 50. Moreover, the gate electrode 21 and overlapping position where the portion of the first electrically conductive layer 20 other than the gate electrode overlaps with the extending portion 322 forms a ring. The gate electrode 21 and the overlapping position of the first electrically conductive layer 20 and the extending portion 322 may receive the current or voltage signal almost synchronously, which is advantageous for reducing the negative effect due to lack of capacitance compensation resulting from signal delay between the gate electrode 21 and the overlapping position where the first electrically conductive layer 20 overlaps with the extending portion 322. However, the embodiment of the present disclosure is not limited thereto. For example, the first electrically conductive layer 20 does not necessarily form a closed hollow region, and only an opening is needed to be formed to ensure that the extending portion overlaps with the gate line. In the embodiment of FIG. 4a, the hollow area 90 is not closed.

Figure 3:
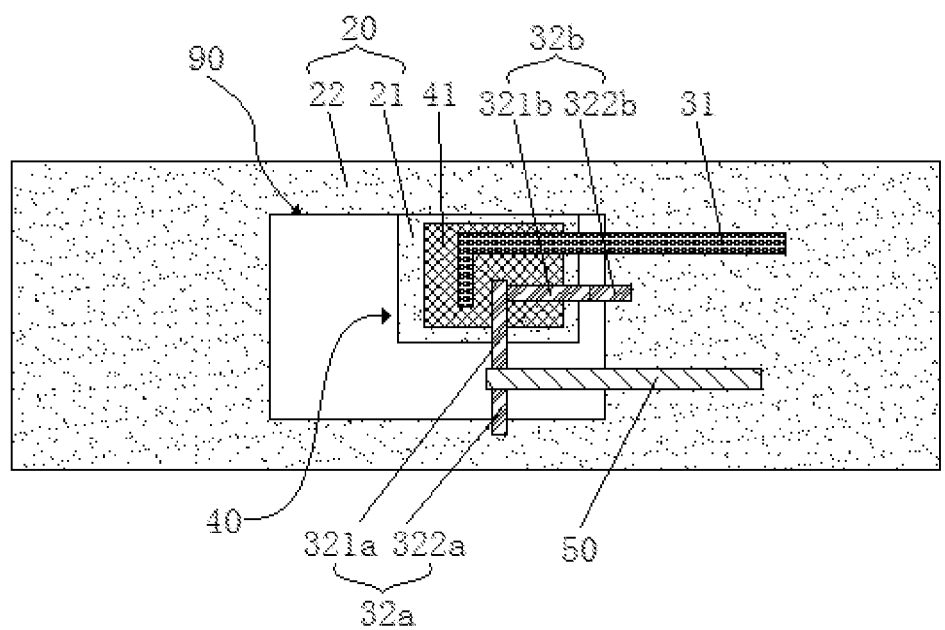
FIG. 3 is a top view showing a structure of an array substrate provided by another embodiment of the present disclosure.

In addition to the foregoing embodiments, in some optional embodiments, referring to FIG. 3, the TFT may include a first drain electrode 32a and a second drain electrode 32b. For example, the first drain electrode 32a and the second drain electrode 32b are perpendicular to each other. Of course, other angles may also be possible. The first drain electrode 32a includes a first electrode body 321a and a first extending portion 322a, and the second drain electrode 32b includes a second electrode body 321b and a second extending portion 322b. Both the first electrode body 321a and the second electrode body 321b overlap with the gate electrode of the TFT. Both the first extending portion 322a and the second extending portion 322b overlap with the first electrically conductive layer 20 in the non-TFT region. The extending directions of the first extending portion 322a and the second extending portion 322b are different from each other. For example, the extending directions of the first extending portion 322a and the second extending portion 322b are perpendicular to each other. Of course, other angles may also be possible. In the case where the overlapping portion of the first electrode body 321a and the gate electrode 21 is decreased or increased (for example, fluctuates in the up-and-down direction in FIG. 3), the overlapping portion of the first extending portion 322a and the first electrically conductive layer 20 is increased or decreased accordingly. Likewise, in the case where the overlapping portion of the second electrode body 321b and the gate electrode 21 is decreased or increased (for example, fluctuates in the left-and-right direction in FIG. 3), the overlapping portion of the second extending portion 322b and the first electrically conductive layer 20 is increased or decreased accordingly. As a result, the capacitance compensation in two perpendicular directions may be achieved.

As an example, the first drain electrode 32*a* and the second drain electrode 32*b* may be independent of each other. The second drain electrode 32*b* may be connected to the lead-out electrode layer through another via hole. In an example, as shown in FIG. 3, the first drain electrode 32*a* and the second drain electrode 32*b* may be connected to each other. In particular, the first drain electrode 32*a* and the second drain electrode 32*b* are connected in corresponding region of the active layer of the TFT. Thus it is not necessary to provide any via holes on the second drain electrode 32*b* for electrically connection to the lead-out electrode layer, which simplifies the process.

As an example, referring to FIG. 3, a hollow region 90 is formed in the first electrically conductive layer 20. The TFT 40 is located in the hollow region 90, the gate electrode 21 is also located in the hollow region 90, and the via hole 80 may be located in the hollow area 90 too. In this way, on one hand, wirings in the first electrically conductive layer 20 can be arranged more compactly, and on the other hand, the gate electrode 21 and the position where the first electrically conductive layer 20 protrudes and overlaps with the extending portion 322*a*/322*b* form a ring, with weak current or voltage difference therebetween, which is beneficial to reduce the impact of fluctuations in the overlapping area of the drain electrode 32 and the first electrically conductive layer 20 on the lead-out electrode. Moreover, the gate electrode 21 and overlapping position where the portion of the first electrically conductive layer 20 protrudes and overlaps with the extending portion 322*a*/322*b* form a ring. The gate electrode 21 and the overlapping position of the first electrically conductive layer 20 and the extending portion 322*a*/322*b* may receive the current or voltage signal almost synchronously, which is advantageous for reducing the negative effect due to lack of capacitance compensation resulting from signal delay between the gate electrode 21 and the overlapping position where the first electrically conductive layer 20 overlaps with the extending portion 322*a*/322*b*.

The embodiments of the present disclosure also provide an array substrate according to another embodiment which is capable of reducing, preventing, or solving the problem that the overlapping area of the drain electrode and the gate line fluctuates. As shown in the drawings, FIG. 4 is a top view of an array substrate provided by an embodiment of the present disclosure (in order to illustrate the improved structure more clearly, some structures such as a base substrate 10, a gate insulating layer 60 and a protective layer 70, etc. are omitted in FIG. 4).

The array substrate includes a base substrate 10 (see FIG. 2), and a first electrically conductive layer 20 and a second electrically conductive layer disposed on the base substrate 10. The base substrate 10 is further provided with a TFT 40 thereon. The first electrically conductive layer 20 includes the gate electrode 21 of the TFT 40. The second electrically conductive layer includes the source electrode 31 and the drain electrode 32 of the TFT 40. The drain electrode 32 of the TFT 40 includes an electrode body 321 and an extending portion 322. The electrode body 321 overlaps with the gate electrode 21 of the TFT. The extending portion 322 overlaps with the first electrically conductive layer 20 in the non-TFT region. That is, the extending portion 322 overlaps with a portion of the first electrically conductive layer 20 other than the gate electrode 21. Thus, in the case where the area of the region where the electrode body 321 overlaps with the gate electrode 21 is decreased or increased, the overlapping portion of the extending portion 322 and the first electrically conductive layer 20 may be increased or decreased accordingly, thereby compensating for the offset of the drain electrode.

Figure 4:
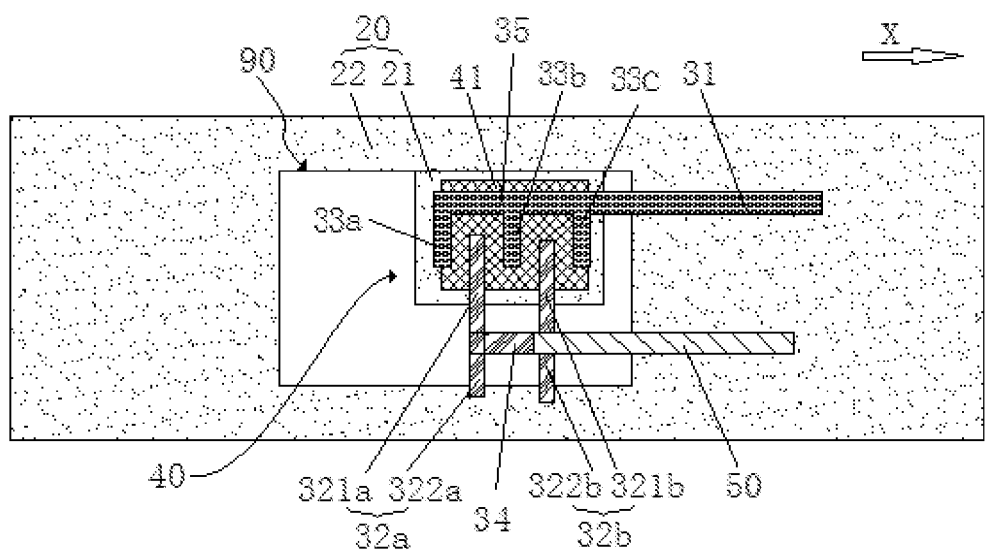
FIG. 4 is a top view showing a structure of an array substrate provided by yet another embodiment of the present disclosure.
Figure 4A:
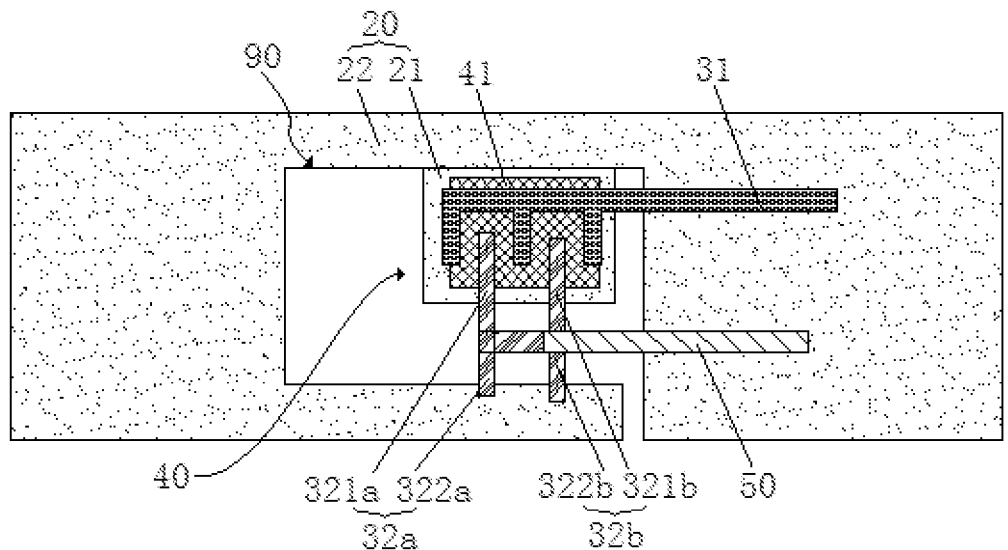
FIG. 4a is a top view showing a structure of an array substrate provided by still another embodiment of the present disclosure.

As shown in FIG. 4, the TFT 40 includes a plurality of comb-shaped drain electrode sub-portions 32*a*/32*b* and corresponding comb-shaped source electrode sub-portions. In an example, in the case where the TFT 40 includes a plurality of comb-shaped drain electrode sub-portions 32*a*/32*b*, each of the drain electrode sub-portions 32*a*/32*b* includes an electrode body 321*a*/321*b* and an extending portion 322*a*/322*b*. Each of the extending portions 322*a*/322*b* overlaps with the first electrically conductive layer 20 to ensure a better stability of the TFTs on the array substrate. As an example, in the case where the TFT 40 includes a plurality of comb-shaped drain electrode sub-portions 32*a*/32*b*, the overlapping areas of the electrode body 321*a*/321*b* of each of the drain electrode sub-portions 32*a*/32*b* and the gate electrode 21 are different from each other. Correspondingly, the overlapping areas of the extending portion 322*a*/322*b* corresponding to each of the drain electrode sub-portions 32*a*/32*b* and the first electrically conductive layer 20 are also different from each other so as to better ensure the stability of the TFT on the array substrate. Of course, the overlapping areas of the electrode body 321*a*/321*b* of each of the drain electrode sub-portions 32*a*/32*b* and the gate electrode 21 may also be same. Correspondingly, the overlapping areas of the extending portion 322*a*/322*b* corresponding to each of the drain electrode sub-portions 32*a*/32*b* and the first electrically conductive layer 20 may also be same.

It can be seen from the above embodiments that in the array substrate provided by the embodiments of the present disclosure, the drain electrode of the TFT is provided with an extending portion which overlaps with the first electrically conductive layer in the non-TFT region, so that in the case where the overlapping portion of the electrode body and the gate electrode is decreased or increased, the overlapping portion of the extending portion and the first electrically conductive layer is increased or decreased accordingly. As a result, the overlap capacitance between the drain electrode of the TFT and the first electrically conductive layer may have a reduced deviation which is resulted from the fabrication process, thereby ensuring the stability of the TFT on the array substrate. Additionally, the drain electrode and the source electrode are both arranged to be comb-shaped, which may further improve the stability of the TFT. It is appreciated that the non-TFT region refers to the region without any TFTs that may operate independently. That is, in the non-TFT region there are no independently operable TFTs.

In order to realize a narrow frame, the array substrate is usually designed to use GOA (Gate driver on Array) technology. However, the GOA design needs more TFTs, and the output TFT of the GOA design needs high drive capability, better stability, and generally larger size. Therefore, for example, applying the improved TFT of the array substrate in the foregoing embodiment to the array substrate with GOA design may lead to a better stability of the TFT in the GOA region.

As an example, referring to FIG. 4, the first electrically conductive layer 20 further includes a gate line 22 connected to the gate electrode 21 of the TFT 40. The extending portion 322*a*/322*b* overlaps with the gate line 22 in the non-TFT region. The length of the overlapping portion of the extending portion 322*a*/322*b* and the gate line 22 in the widthwise direction of the gate line (for example, as shown in FIG. 4, this length is the length of the portion of the extending portion 322a/322b extending into the gate line 22) are not greater than ⅓ of the width of the gate line 22 at the overlapping region (the width of the gate line 22 as referred to herein refers to the width of the gate line 22 at the positions where the gate line 22 overlaps with the extending portions 322 and the width may vary as the overlapping position changes). By defining the length of the overlapping portion of the extending portion 322a/322b and the gate line 22, the variation of the area of the overlapping portion of the extending portion 322a/322b and the gate line 22 may be consistent with the variation of the area of the overlapping portion of the electrode body 321 and the gate electrode 21.

Referring to FIG. 4, a gate insulating layer 60 and an active layer 41 are further disposed between the gate electrode 21 and the electrode body 321a/321b. For example, an active material layer 42 is also disposed below the extending portion 322a/322b. In this way, the height of the extending portion 322a/322b may be arranged consistent with the height of the electrode body 321a/321b, thereby further improving the stability of the overlap capacitance between the drain electrode and the first electrically conductive layer. In addition, it is also possible to ensure that the capacitance formed between the extending portion 322a/322b and the first electrically conductive layer may compensate for the variation of the capacitance between the corresponding electrode body 321a/321b and the gate electrode 21. Apparently, the embodiment of the present disclosure is not limited thereto. For example, the active material layer 42 may be absent below the extending portion 322.

As an example, referring to FIG. 4 and FIG. 2, the lead-out electrode layer 50 is electrically connected to the drain electrode 32b through a via hole 80, and the via hole 80 is located between the electrode body 321b and the extending portion 322b. In particular, the distance from the via hole 80 to the distal end of the electrode body 321b (the end of the electrode body 321b away from the via hole 80) is equal to the distance from the via hole 80 to the distal end of the extending portion part 322b of the drain electrode (the end of the extending portion part 322b away from the via hole 80). Advantageously, even if the electrode body 321b offsets from the gate electrode 21 and the deviation may be transferred to the lead-out electrode at the via hole 80, however, the overlap capacitance between the extending portion 322b and the gate line 22 in the opposite direction may rapidly be compensated so as to quickly counteract the deviation between the electrode body 321b and the gate electrode 21. Therefore, the lead-out electrode at the via hole 80 is less affected by the fluctuation of the overlapping area of the drain electrode and the first electrically conductive layer. Of course, it may be seen that the position of the via hole 80 may also be disposed between the electrode body 321a and the extending portion 322a, and it may have similar effects.

As an example, the extending portion 322a/322b and its corresponding electrode body 321a/321b are located in the same straight line, and the extending portion 322a/322b is perpendicular to the gate line in the first electrically conductive layer 20, so as to simplify the manufacturing process. As an example, the overlapping area of the extending portion 322a/322b and the first electrically conductive layer 20 is slightly smaller than or equal to the overlapping area of its corresponding electrode body 321a/321b and the gate electrode 21, so that the performance of the TFT itself may be ensured with the variation of the overlap capacitance reduced. As an example, in the case where the end of the electrode body 321a/321b is curved, the end of the extending portion 322a/322b is also curved so as to ensure the consistency between them. As an example, the end of the electrode body 321a/321b that is close to the source electrode is slightly smaller than the end of the extending portion 322a/322b so as to ensure that the end of the extending portion 322a/322b may be easily overlapped with the first electrically conductive layer 20, irrespective of the larger or smaller fluctuation of the overlapping area of the electrode body 321a/321b and the gate electrode 21. As an example, the sum of the overlap capacitance between the electrode body 321a/321b and the gate electrode 21 and the overlap capacitance between its corresponding extending portion 322a/322b and the gate line 20 is a constant value so as to minimize the deviation of the overlap capacitance between the drain electrode of the TFT and the first electrically conductive layer due to the process, thereby ensuring a better stability of the TFT on the array substrate.

As an example, in the case where the active material layer is disposed below the extending portion 322a/322b, the active material layer and the active layer 41 of the TFT 40 are connected to each other, so as to simplify the manufacturing process. In an example, in the case where the active material layer 42 is disposed under the extending portion 322a/322b, no source electrodes are provided in the region where the extending portion 322a/322b overlaps with the active material layer, so as to ensure that the extending portion 322a/322b is only used to adjust the overlap capacitance between the drain electrode of the TFT and the first electrically conductive layer without affecting the other performance of the TFT. In an example, in the case where the lead-out electrode layer 50 is electrically connected to the drain electrode 32 through the via hole 80, a metal pad 81 is disposed under the via hole 80. By means of the metal pad 81, the drain electrode 32 at the via hole 80 may be lifted to a certain extent such that the depth of the via hole 80 may be decreased, thereby reducing the problem of disconnection due to the excessive depth of the via hole 80.

As an example, referring to FIG. 4, a hollow region 90 is formed in the first electrically conductive layer 20. The TFT 40 is located in the hollow region 90, the gate electrode 21 is also located in the hollow region 90, and the via hole 80 is located in the hollow area 90 too. In this way, on one hand, wirings in the first electrically conductive layer can be arranged more compactly, and on the other hand, the gate electrode 21 and the position where the first electrically conductive layer 20 protrudes and overlaps with the extending portion 322a/322b form a ring, with weak current or voltage difference therebetween, which is beneficial to reduce the impact of fluctuations in the overlapping area of the drain electrode 32 and the first electrically conductive layer 20 on the lead-out electrode. Moreover, the gate electrode 21 and overlapping position where the portion of the first electrically conductive layer 20 protrudes and overlaps with the extending portion 322a/322b form a ring. The gate electrode 21 and the overlapping position of the first electrically conductive layer 20 and the extending portion 322a/322b may receive the current or voltage signal almost synchronously, which is advantageous for reducing the negative effect due to lack of capacitance compensation resulting from signal delay between the gate electrode 21 and the overlapping position where the first electrically conductive layer 20 overlaps with the extending portion 322a/322b.

Figure 5:
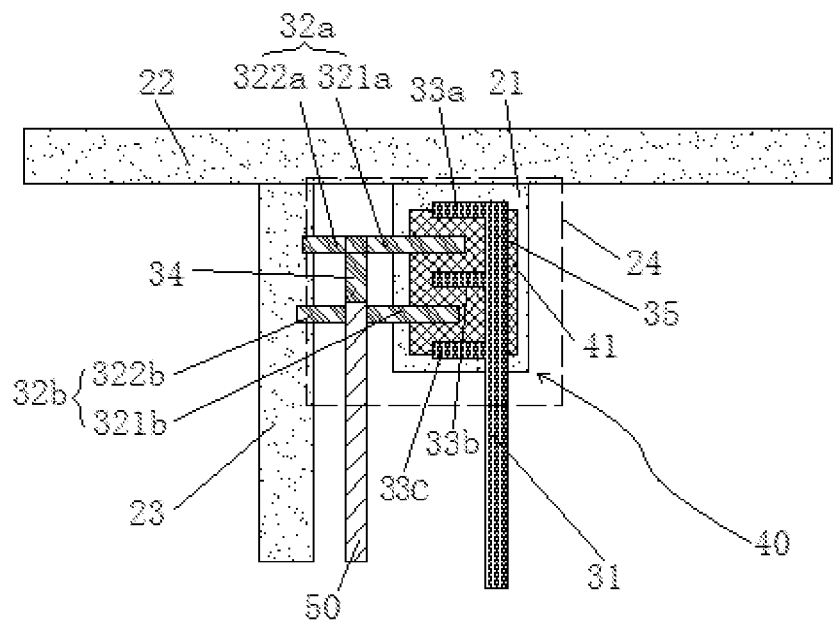
FIG. 5 is a top view showing a structure of an array substrate provided by another embodiment of the present disclosure.

The embodiments of the present disclosure also provide an array substrate according to yet another embodiment which is capable of reducing, preventing, or solving the problem that the overlapping area of the drain electrode and the gate line fluctuates. As shown in the drawings, FIG. 5 is a top view of an array substrate provided by an embodiment of the present disclosure (in order to illustrate the improved structure more clearly, some structures such as the base substrate 10, the gate insulating layer 60 and the protective layer 70, etc. are omitted in FIG. 5).

The array substrate includes a base substrate 10 (see FIG. 2), a first electrically conductive layer 20, a second electrically conductive layer and a TFT 40 disposed on the base substrate 10. The first electrically conductive layer includes the gate electrode 21 of the TFT 40. The second electrically conductive layer includes the source electrode 31 and the drain electrode 32a/32b of the TFT 40. The drain electrode 32a/32b of the TFT 40 includes an electrode body 321a/321b and a corresponding extending portion 322a/322b. The electrode body 321a/321b overlaps with the gate electrode 21 of the TFT 40. The extending portion 322a/322b overlaps with the first electrically conductive layer 20 in the non-TFT region. In the case where the overlapping portion of the electrode body 321a/321b and the gate electrode 21 is decreased or increased, the overlapping portion of the extending portion 322a/322b and the first electrically conductive layer 20 may be increased or decreased accordingly, thereby compensating for the offset.

The first electrically conductive layer 20 includes a protrusion 23. The protrusion 23 overlaps with the extending portion 322a/322b. In the case where the overlapping portion of the electrode body 321a/321b and the gate electrode 21 is decreased or increased, the overlapping portion of the extending portion 322a/322b and the protrusion 23 of the first electrically conductive layer 20 may be increased or decreased accordingly. In an example, the first electrically conductive layer further includes a gate line 22 connected to the gate electrode 21 of the TFT 40. The gate electrode 21 of the TFT 40 is located in the recess formed by the gate line 22 and the protrusion 23 (referring to the position enclosed by the dashed line block 24 in FIG. 5), thereby enabling the array substrate to be formed in a more compact configuration. As an example, the length of the protrusion 23 is greater than the length of the gate electrode 21, which may minimize the impact of the process on the TFT, and ensure the extending portion 322a/322b to be overlapped sufficiently with the protrusion 23 of the first electrically conductive layer 20.

It can be seen from the above embodiments that in the array substrate provided by the embodiments of the present disclosure, the drain electrode of the TFT is provided with an extending portion which overlaps with the protrusion of the first electrically conductive layer in the non-TFT region, so that in the case where the overlapping portion of the electrode body and the gate electrode is decreased or increased, the overlapping portion of the extending portion and the protrusion of the first electrically conductive layer is increased or decreased accordingly. As a result, the overlap capacitance between the drain electrode of the TFT and the first electrically conductive layer may have a reduced deviation which is resulted from the fabrication process, thereby ensuring the stability of the TFT on the array substrate. It is appreciated that the non-TFT region refers to the region without any TFT that may operate independently. That is, in the non-TFT region there are no independently operable TFTs.

It should be noted that the position of the protrusion in the above-mentioned array substrate may be changed according to the arrangement of the TFT itself, and should not be limited to the arrangement shown in FIG. 5.

In order to realize a narrow frame, the array substrate is usually designed to use GOA (Gate driver on Array) technology. However, the GOA design needs more TFTs, and the output TFT of the GOA design needs high drive capability, better stability, and generally larger size. Therefore, optionally, applying the improved TFT of the array substrate in the foregoing embodiment to the array substrate with GOA design may lead to a better stability of the TFT in the GOA region.

As an example shown in FIG. 5, the TFT 40 includes a plurality of comb-shaped drain electrode sub-portions 32a/32b and corresponding comb-shaped source electrode sub-portions. As an example, the source electrode sub-portions include a first source electrode sub-portion 33a, a second source electrode sub-portion 33b, and a third source electrode sub-portion 33c. In some embodiments, the first source electrode sub-portion 33a, the second source electrode sub-portion 33b, and the third source electrode sub-portion 33c overlap with the gate electrode 21 and extend in the same direction as the first extending portion 322a and the second extending portion 322b. As an example, the plurality of drain electrode sub-portions and the plurality of source electrode sub-portions may be alternately arranged in a first direction x parallel (see FIG. 4) to the base substrate. The stability of the TFT may be further improved by arranging the drain electrode and the source electrode both to be comb-shaped. As an example, in the case where the TFT 40 includes a plurality of comb-shaped drain electrode sub-portions 32a/32b, each of the drain electrode sub-portions 32a/32b includes an electrode body 321a/321b and an extending portion 322a/322b. Each of the extending portions 322a/322b overlaps with the first electrically conductive layer 20 to ensure a better stability of the TFTs on the array substrate. As an example, in the case where the TFT 40 includes a plurality of comb-shaped drain electrode sub-portions 32a/32b, the overlapping areas of the electrode body 321a/321b of each of the drain electrode sub-portions 32a/32b and the gate electrode 21 are different from each other. Correspondingly, the overlapping areas of the extending portion 322a/322b corresponding to each of the drain electrode sub-portions 32a/32b and the first electrically conductive layer 20 are also different from each other, so as to better ensure the stability of the TFT on the array substrate. Of course, the overlapping areas of the electrode body 321a/321b of each of the drain electrode sub-portions 32a/32b and the gate electrode 21 may also be same. Correspondingly, the overlapping areas of the extending portion 322a/322b corresponding to each of the drain electrode sub-portions 32a/32b and the first electrically conductive layer 20 may also be same. In some embodiments, the drain electrode may include a drain electrode connection part 34 electrically connecting the plurality of drain electrode sub-portions 32a/32b, and the source electrode may include a source electrode connection part 35 electrically connecting the plurality of source electrode sub-portions 33a/33b/33c. For example, the drain electrode connection part 34 is connected to the plurality of drain electrode sub-portions at a right angle.

In some embodiments, at least a portion of an orthogonal projection of the drain electrode connection part 34 on the base substrate is located between an orthogonal projection of the gate electrode 21 on the base substrate and an orthogonal projection of the portion of the first electrically conductive layer other than the gate electrode 21 on the base substrate.

In some embodiments, the array substrate may further include: a lead-out electrode layer 50 electrically connected to the drain electrode through a via hole. An orthogonal projection of the via hole on the base substrate is located between the orthogonal projection of the gate electrode 21 on the base substrate and the orthogonal projection of the portion of the first electrically conductive layer other than the gate electrode 21 on the base substrate.

For example, the lead-out electrode layer may extend in a same direction as the drain electrode connection part 34.

In some embodiments, the first drain electrode sub portion is perpendicular to the gate line.

As an example, referring to FIG. 5, the length of the overlapping portion of the extending portion 322a/322b and the protrusion 23 in the widthwise direction of the gate line (for example, as shown in FIG. 4, this length is the length of the portion of the extending portion 322a/322b extending into the gate line 22) are not greater than ⅓ of the width of the protrusion 23 at the overlapping region (the width of the protrusion 23 as referred to herein refers to the width of the protrusion 23 at the positions where the protrusion 23 overlaps with the extending portions 322 and the width may vary as the overlapping position changes). By defining the length of the overlapping portion of the extending portion 322a/322b and the protrusion 23, the variation of the area of the overlapping portion of the extending portion 322a/322b and the protrusion 23 may be consistent with the variation of the area of the overlapping portion of the electrode body 321a/321b and the gate electrode 21.

In some embodiments, as shown in FIG. 5, the first electrically conductive layer 20 may further include a gate line 22 electrically connected to the gate electrode 21 and at least one protrusion 23 projecting from the gate line 22. The protrusion 23 is separated from the gate electrode 21, and at least one of the drain electrode and the source electrode overlaps with each of the gate electrode 21 and the protrusion 23. The protrusion 23 and the gate electrode 21 project from the gate line 22 in a same direction, and a length by which the protrusion 23 projects from the gate line 22 is greater than a length by which the gate electrode 21 projects from the gate line 22. The array substrate may further include: a lead-out electrode layer 50 electrically connected to the drain electrode through a via hole. An orthogonal projection of the via hole on the base substrate is located between an orthogonal projection of the gate electrode 21 on the base substrate and an orthogonal projection of the protrusion 23 on the base substrate.

In some embodiments, the drain electrode includes a first drain electrode sub-portion 32a and a second drain electrode sub-portion 32b extending parallel to each other and a drain electrode connection part 34 electrically connecting the first drain electrode sub-portion 32a and the second drain electrode sub-portion 32b. The drain electrode connection part 34 extends in a same direction as the lead-out electrode layer 50.

Referring to FIG. 4, a gate insulating layer 60 and an active layer 41 are further disposed between the gate electrode 21 and the electrode body 321a/321b. For example, an active material layer 42 may also be disposed below the extending portion 322a/322b. In this way, the height of the extending portion 322a/322b may be arranged consistent with the height of the electrode body 321a/321b, thereby further improving the stability of the overlap capacitance between the drain electrode and the first electrically conductive layer. In addition, it is also possible to ensure that the capacitance formed between the extending portion 322a/322b and the first electrically conductive layer may compensate for the variation of the capacitance between the electrode body 321a/321b and the gate electrode 21.

As an example, referring to FIG. 4 and FIG. 2, the lead-out electrode layer 50 is electrically connected to the drain electrode 32b through a via hole 80, and the via hole 80 is located between the electrode body 321b and the extending portion 322b. In particular, the distance from the via hole 80 to the distal end of the electrode body 321b (the end of the electrode body 321b away from the via hole 80) is equal to the distance from the via hole 80 to the distal end of the extending portion 322b of the drain electrode (the end of the extending portion 322b away from the via hole 80). Advantageously, even if the electrode body 321b offsets from the gate electrode 21 and the deviation may be transferred to the lead-out electrode layer 50 at the via hole 80, the overlap capacitance between the extending portion 322b and the protrusion 23 in the opposite direction may rapidly compensate so as to quickly counteract the deviation between the electrode body 321b and the gate electrode 21. Therefore, the lead-out electrode at the via hole 80 is less affected by the fluctuation of the overlapping area of the drain electrode and the first electrically conductive layer. Of course, it may be seen that the position of the via hole 80 may also be disposed between the electrode body 321a and the extending portion 322a, and may have the similar effects.

As an example, the extending portion 322a/322b and its corresponding electrode body 321a/321b are located in the same straight line, and the extending portion 322a/322b is perpendicular to the protrusion 23, so as to simplify the manufacturing process. As an example, the overlapping area of the extending portion 322a/322b and the protrusion 23 is slightly smaller than or equal to the overlapping area of its corresponding electrode body 321a/321b and the gate electrode 21, so that the performance of the TFT itself may be ensured with the variation of the overlap capacitance reduced. As an example, in the case where the end of the electrode body 321a/321b is curved, the end of the extending portion 322a/322b is also curved so as to ensure the consistency between them. In an example, the end of the electrode body 321a/321b that is close to the source electrode is slightly smaller than the end of the extending portion 322a/322b so as to ensure that the end of the extending portion 322a/322b may be easily overlapped with the protrusion, irrespective of the larger or smaller fluctuation of the overlapping area of the electrode body 321a/321b and the gate electrode 21. As an example, the sum of the overlap capacitance between the electrode body 321a/321b and the gate electrode 21 and the overlap capacitance between its corresponding extending portion 322a/322b and the protrusion 23 is a constant value so as to minimize the deviation of the overlap capacitance between the drain electrode of the TFT and the first electrically conductive layer due to the process, thereby ensuring a better stability of the TFT on the array substrate.

As an example, in the case where the active material layer 42 is disposed below the extending portion 322a/322b, the active material layer 42 and the active layer 41 of the TFT 40 are connected to each other, so as to simplify the manufacturing process. In an example, in the case where the active material layer 42 is disposed under the extending portion 322a/322b, no source electrodes are provided in the region where the extending portion 322a/322b overlaps with the active material layer 42, so as to ensure that the extending portion 322a/322b is only used to adjust the overlap capacitance between the drain electrode of the TFT and the first electrically conductive layer 20 without affecting the other performance of the TFT. As an example, in the case where the lead-out electrode layer 50 is electrically connected to the drain electrode 32 through the via hole 80, a metal pad 81 is disposed under the via hole 80. By means of the metal pad 81, the drain electrode 32 at the via hole 80 may be lifted to a certain extent such that the depth of the via hole 80 may be decreased, thereby reducing the problem of disconnection due to the excessive depth of the via hole 80.

Figure 6:
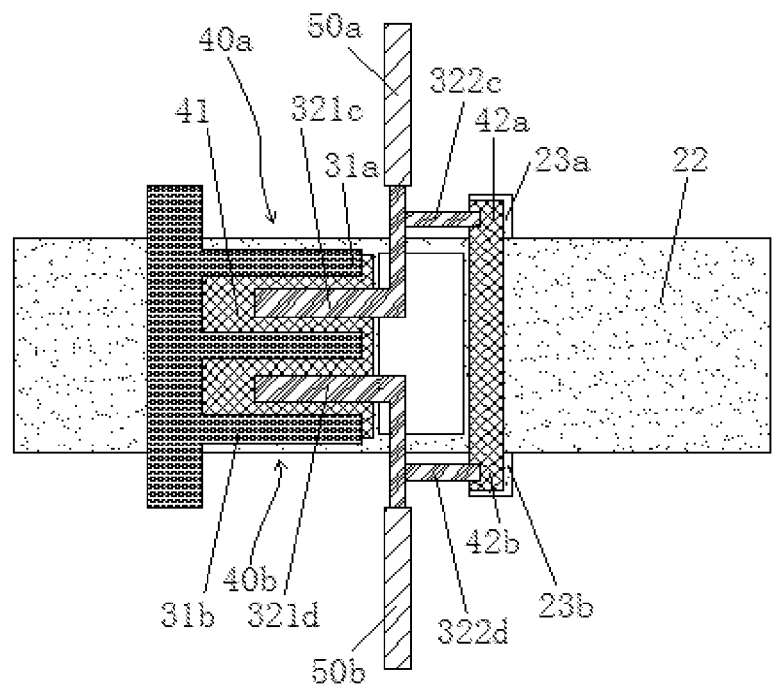
FIG. 6 is a top view showing a structure of an array substrate provided by another embodiment of the present disclosure.

The embodiments of the present disclosure also provide an array substrate according to still another embodiment which is capable of reducing, preventing, or solving the problem that the overlapping area of the drain electrode and the gate line fluctuates. As shown in the drawings, FIG. 6 is a top view of an array substrate provided by an embodiment of the present disclosure (in order to illustrate the improved structure more clearly, some structures such as the base substrate 10, the gate insulating layer 60 and the protective layer 70, etc. are omitted in FIG. 6).

The array substrate includes a base substrate 10 (see FIG. 2), and a first electrically conductive layer and a second electrically conductive layer disposed on the base substrate 10. The base substrate 10 is further provided with a TFT thereon.

The TFTs includes at least 2 TFTs, including the first TFT 40a and the second TFT 40b; the first TFT 40a and the second TFT 40b share the active layer 41, and the drain electrode (or source electrode) of the first TFT 40a and the drain electrode (or source electrode) of the second TFT 40b are respectively connected to different electronic elements or functional units, such as other different GOA units in a GOA gate driving circuit, different input/output lines, or other devices in one and the same GOA unit (such as TFT, inverters, etc.). Similarly, based on the same principle, the way that the first TFT 40a and the second TFT 40b are connected to other electronic elements or functional circuits when they are in other circuit configurations may be obtained, which will not be described any longer herein.

The first electrically conductive layer includes a first gate electrode of the first TFT 40a and a second gate electrode of a second TFT 40b. Of course, the gate electrodes of the first TFT 40a and the second TFT 40b may be formed in the first electrically conductive layer. The second electrically conductive layer includes the source electrode 31a of the first TFT 40a and the source electrode 31b of the second TFT 40b, and the drain electrode of the first TFT 40a and the drain electrode of the second TFT 40b.

The drain electrode of the first TFT 40a includes an electrode body 321c and an extending portion 322c. The drain electrode of the second TFT 40a includes an electrode body 321d and an extending portion 322d. The electrode body 321c overlaps with the gate electrode of the first TFT 40a. The electrode body 321d overlaps with the gate electrode of the second TFT 40b. The extending portion 322c of the first TFT 40a overlaps with the first electrically conductive layer 20. The extending portion 322d of the second TFT 40b also overlaps with the first electrically conductive layer 20.

In the case where the overlapping portion of the electrode body 321c and the first gate electrode is decreased or increased (for example, fluctuates in the left-and-right direction in FIG. 6), the overlapping portion of the extending portion 322c and the first electrically conductive layer is increased or decreased. In the case where the overlapping portion of the electrode body 321d and the gate electrode of the second TFT 40b is decreased or increased, the overlapping portion of the extending portion 322d and the first electrically conductive layer is increased or decreased.

It can be seen from the above embodiments that in the array substrate provided by the embodiments of the present disclosure, the drain electrode of each of the first TFT and second TFT is provided with an extending portion which overlaps with the first electrically conductive layer in the non-TFT region, so that in the case where the overlapping portion of the electrode body of any one of the first TFT and second TFT and the gate electrode is decreased or increased, the overlapping portion of the extending portion and the first electrically conductive layer is increased or decreased accordingly. As a result, the overlap capacitance between the drain electrode of the TFT and the first electrically conductive layer may have a reduced deviation which is resulted from the fabrication process, thereby ensuring the stability of the TFT on the array substrate. It is appreciated that the non-TFT region refers to the region without any TFT that may operate independently. That is, in the non-TFT region there are no independently operable TFTs.

In order to realize a narrow frame, the array substrate is usually designed to use GOA (Gate driver on Array) technology. However, the GOA design needs more TFTs, and the output TFT of the GOA design needs high drive capability, better stability, and generally larger size. In addition, in the GOA area there are usually a lot of TFTs which are connected in different manners. In order to reduce the layout space, some TFTs may share the active layer. Therefore, optionally, applying the improvement of the first TFT and second TFT on the array substrate in the foregoing embodiment to the array substrate with GOA design may lead to a better stability of the TFT in the GOA region.

As an example, referring to FIG. 6, the first electrically conductive layer 20 further includes a first protrusion 23a and a second protrusion 23b. The extending portion 322c of the drain electrode (or source electrode) of the first TFT 40a overlaps with the first protrusion 23a. The extending portion 322d of the drain electrode (or source electrode) of the second TFT 40b overlaps with the second protrusion 23b.

The extending portion 322c of the drain electrode (or source electrode) of the first TFT 40a and the extending portion 322d of the drain electrode (or source electrode) of the second TFT 40b are respectively located on two sides of the same gate line 22 of the first electrically conductive layer. The first protrusion 23a and the second protrusion 23b are respectively located on two sides of the same gate line 22 of the first electrically conductive layer. Through the above design, the manufacturing process may be simpler and more convenient, and the device may be more compact.

As an example, a first active material layer 42a is disposed between the extending portion 322c of the drain electrode (or source electrode) of the first TFT 40a, and a second active material layer 42b is disposed between the extending portion 322d and the second protrusion 23b. In this way, the height of the extending portion 322c and the height of the extending portion 322d may be arranged consistent with the height of the electrode body 321c of the drain electrode (or source electrode) of the first TFT 40a and the height of the electrode body 321d of the drain electrode (or source electrode) of the second TFT 40b, thereby further improving the stability of the overlap capacitance between the drain electrode and the first electrically conductive layer. In addition, it is also possible to ensure that the capacitance formed between the extending portion 322c/322d of the drain electrodes (or source electrodes) of the first/second TFT 40a/40b and the first electrically conductive layer 20 may compensate for the variation of the capacitance formed between the electrode body 321c/321d of the drain electrodes (or source electrodes) of the first/second TFT 40a/40b and the gate electrode 21. As an example, as shown in FIG. 6, the first active material layer 42a and the second active material layer 42b are formed integrally, thereby simplifying the manufacturing process. As an example, in the case where the first active material layer 42 and the second active material layer 42*b* are connected to the active layer 41 shared by the first TFT 40*a* and the second TFT 40*b*, so as to simplify the manufacturing process. In an example, no source electrodes are provided in the region where the extending portion 322*c* of the drain electrode (or source electrode) of the first TFT 40*a* overlaps with the first active material layer 42*a* and the region where the extending portion 322*d* of the drain electrode (or source electrode) of the second TFT 40*b* overlaps with the second active material layer 42*b*, so as to ensure that the extending portion 322*c* of the drain electrode (or source electrode) of the first TFT 40*a* and the extending portion 322*d* of the drain electrode (or source electrode) of the second TFT 40*b* are only used to adjust the overlap capacitance between the drain electrode of the TFT and the first electrically conductive layer without affecting the other performance of the TFT.

As an example, the extending portion 322*c* of the drain electrode (or source electrode) of the first TFT 40*a* has the same area as the extending portion 322*d* of the drain electrode (or source electrode) of the second TFT 40*b*. As an example, the first protrusion 23*a* has the same area as the second protrusion 23*b*. In this way, the manufacturing process may be simplified while the consistency and the stability may be improved.

As an example, referring to FIG. 6, the length of the overlapping portion of the extending portion 322*c* of the drain electrode (or source electrode) of the first TFT 40*a* and the first protrusion 23*a* in the widthwise direction of the first protrusion is not greater than one third of the first protrusion 23*a* at the overlapping portion. The length of the overlapping portion of the extending portion 322*d* of the drain electrode (or source electrode) of the second TFT 40*b* and the second protrusion 23*b* in the widthwise direction of the first protrusion is not greater than one third of the second protrusion 23*b* at the overlapping portion. By defining the length of the overlapping portion of the extending portion 322*c* of the drain electrode (or source electrode) of the first TFT 40*a* and the first protrusion 23*a*, the variation of the area of the overlapping portion of the extending portion 322*c* of the drain electrode (or source electrode) of the first TFT 40*a* and the first protrusion 23*a* may be consistent with the variation of the area of the overlapping portion of the electrode body 321*c* and the first gate electrode. Meanwhile, by defining the length of the overlapping portion of the extending portion 322*d* of the drain electrode (or source electrode) of the second TFT 40*b* and the second protrusion 23*b*, the variation of the area of the overlapping portion of the extending portion 322*d* of the drain electrode (or source electrode) of the second TFT 40*b* and the second protrusion 23*b* may be consistent with the variation of the area of the overlapping portion of the electrode body 321*d* of the drain electrode (or source electrode) of the second TFT 40*b* and the second gate electrode.

As an example, referring to FIG. 6, the first lead-out electrode layer 50*a* is electrically connected to the drain electrode through a first via hole. The first via hole is located between the electrode body 321*c* of the drain electrode (or source electrode) of the first TFT 40*a* and the extending portion 322*c* of the drain electrode (or source electrode) of the first TFT 40*a*. In particular, the distance from the first via hole to the distal end of the electrode body 321*c* of the drain electrode (or source electrode) of the first TFT 40*a* (the end of the electrode body 321*c* of the drain electrode (or source electrode) of the first TFT 40*a* away from the first via hole) is equal to the distance from the first via hole to the distal end of the extending portion 322*c* of the drain electrode (or source electrode) of the first TFT 40*a* (the end of the extending portion 322*c* of the drain electrode (or source electrode) of the first TFT 40*a* away from the first via hole). Advantageously, even if the electrode body 321*c* of the drain electrode (or source electrode) of the first TFT 40*a* offsets from the first gate electrode and the deviation may be transferred to the first lead-out electrode at the first via hole, the overlap capacitance between the extending portion 322*c* of the drain electrode (or source electrode) of the first TFT 40*a* and the first protrusion 23*a* in the opposite direction may rapidly compensate so as to quickly counteract the deviation between the electrode body 321*c* of the drain electrode (or source electrode) of the first TFT 40*a* and the first gate electrode. Therefore, the first lead-out electrode at the first via hole is less affected by the fluctuation of the overlapping area of the drain electrode and the first electrically conductive layer. The second lead-out electrode layer 50*b* is electrically connected to the drain electrode (or source electrode) of the second TFT 40*b* through a second via hole. The second via hole is located between the electrode body 321*d* of the drain electrode (or source electrode) of the second TFT 40*b* and the extending portion 322*d* of the drain electrode (or source electrode) of the second TFT 40*b*. In particular, the distance from the second via hole to the distal end of the electrode body 321*d* of the drain electrode (or source electrode) of the second TFT 40*b* (the end of the electrode body 321*d* of the drain electrode (or source electrode) of the second TFT 40*b* away from the second via hole) is equal to the distance from the second via hole to the distal end of the extending portion 322*d* of the drain electrode (or source electrode) of the second TFT 40*b* (the end of the extending portion 322*d* of the drain electrode (or source electrode) of the second TFT 40*b* away from the second via hole). Advantageously, even if the electrode body 321*d* of the drain electrode (or source electrode) of the second TFT 40*b* offsets from the second gate electrode and the deviation may be transferred to the second lead-out electrode at the second via hole, the overlap capacitance between the extending portion 322*d* of the drain electrode (or source electrode) of the second TFT 40*b* and the second protrusion 23*b* in the opposite direction may rapidly compensate so as to quickly counteract the deviation between the fourth electrode body 321*d* and the second gate electrode. Therefore, the second lead-out electrode at the second via hole is less affected by the fluctuation of the overlapping area of the drain electrode and the first electrically conductive layer.

As an example, the overlapping area of the extending portion 322*c* of the drain electrode (or source electrode) of the first TFT 40*a* and the first protrusion 23*a* is slightly smaller than or equal to the overlapping area of its corresponding electrode body 321*c* of the drain electrode (or source electrode) of the first TFT 40*a* and the first gate electrode. The overlapping area of the extending portion 322*d* of the drain electrode (or source electrode) of the second TFT 40*b* and the second protrusion 23*b* is slightly smaller than or equal to the overlapping area of its corresponding electrode body 321*d* of the drain electrode (or source electrode) of the second TFT 40*b* and the second gate electrode, so that the performance of the TFT itself may be ensured with the variation of the overlap capacitance reduced. As an example, in the case where the ends of the electrode body 321*c* of the drain electrode (or source electrode) of the first TFT 40*a* and the electrode body 321*d* of the drain electrode (or source electrode) of the second TFT 40*b* are curved, the extending portion 322*c* of the drain electrode (or source electrode) of the first TFT 40*a* and the extending portion 322*d* of the drain electrode (or source electrode) of the second TFT 40*b* are also curved, so as to ensure the consistency between them. As an example, the end of the electrode body 321*c* of the drain electrode (or source electrode) of the first TFT 40*a* close to the source electrode is slightly smaller than the end of the extending portion 322*c* of the drain electrode (or source electrode) of the first TFT 40*a*, the end of the electrode body 321*d* of the drain electrode (or source electrode) of the second TFT 40*b* close to the source electrode is slightly smaller than the end of the extending portion 322*d* of the drain electrode (or source electrode) of the second TFT 40*b*, so as to ensure that the end of the extending portion 322*a*/322*b* may be easily overlapped with the protrusion 23*a*/23*b*, irrespective of the larger or smaller fluctuation of the overlapping area of the electrode body 321*a*/321*b* and the gate electrode. As an example, the sum of the overlap capacitance between the electrode body 321*c* of the drain electrode (or source electrode) of the first TFT 40*a* and the first gate electrode and the overlap capacitance between its corresponding extending portion 322*c* of the drain electrode (or source electrode) of the first TFT 40*a* and the first protrusion 23*a* is a constant value, and the sum of the overlap capacitance between the electrode body 321*d* of the drain electrode (or source electrode) of the second TFT 40*b* and the second gate electrode and the overlap capacitance between its corresponding extending portion 322*d* of the drain electrode (or source electrode) of the second TFT 40*b* and the second protrusion 23*b* is a constant value, so as to minimize the deviation of the overlap capacitance between the drain electrode of the TFT and the first electrically conductive layer due to the process, thereby ensuring a better stability of the TFT on the array substrate.

As an example, in the case where the first lead-out electrode layer 50*a* is electrically connected to the drain electrode of the first TFT 40*a* through the first via hole, a metal pad 81 is disposed under the first via hole; in the case where the second lead-out electrode layer 50*b* is electrically connected to the drain electrode of the second TFT 40*b* through the second via hole, a metal pad 81 is disposed under the second via hole. By means of the metal pad, the drain electrode 32 at the via hole 80 may be lifted to a certain extent such that the depth of the via hole 80 may be decreased, thereby reducing the problem of disconnection due to the excessive depth of the via hole 80.

It should be noted that the expressions of the third drain electrode, the fourth drain electrode, the third electrode body, the fourth electrode body, the third extending portion, and the fourth extending portion in the present embodiments are not intended to distinguish the same from the first drain electrode, the second drain electrode, the first electrode body, the second electrode body, the first extended portion, and the second extended portion in the embodiments described above. The expressions of "the first, the second, the third and the fourth" are just intended to distinguish in form for the convenience of the description and to avoid the problem of unclear protection scope. Therefore, the protection scope should not be determined based on that they are completely different technical features. As an example, in the embodiments of the present disclosure, the electrode body of the drain electrode may also be referred to as a drain electrode body, and the electrode body of the source electrode may also be referred to as a source electrode body.

As an example, the first electrically conductive layer 20 is an electrically conductive layer including a gate electrode and a gate line of the TFT, and the second electrically conductive layer is a electrically conductive layer including a source electrode and a drain electrode of the TFT.

The embodiments of the present disclosure also provide a display device according to an embodiment which is capable of reducing, preventing, or solving the problem that the overlapping area of the drain electrode and the gate line fluctuates. The display device includes the array substrate according to any embodiment described above.

It is noted that, the display device in the present embodiment may be any product or component with display function, such as electronic paper, mobile phones, tablet computers, liquid crystal displays, liquid crystal televisions, OLED (organic electroluminescent) displays, OLED televisions, display screens of notebook computer, digital photo frames, navigators and the like.

It can be seen from the above embodiments that in the display device provided by the embodiments of the present disclosure, the drain electrode of the TFT is provided with an extending portion which overlaps with the first electrically conductive layer in the non-TFT region, so that in the case where the overlapping portion of the electrode body and the gate electrode is decreased or increased, the overlapping portion of the extending portion and the first electrically conductive layer is increased or decreased accordingly. As a result, the overlap capacitance between the drain electrode of the TFT and the first electrically conductive layer may have a reduced deviation which is resulted from the fabrication process, thereby ensuring the stability of the TFT on the array substrate.

It should be noted that in the embodiments of the present disclosure, the first electrically conductive layer and the second electrically conductive layer may be fabricated with metal materials, such as copper (Cu), aluminum (Al), molybdenum (Mo), titanium (Ti), chromium (Cr), tungsten (W) or alloys of any materials selected from these materials. The first electrically conductive layer may be configured as a single layer structure or a multi-layer structure, such as Mo\Al\Mo, Ti\Cu\Ti, or Mo\Ti\Cu. The gate insulating layer may be fabricated with silicon nitride or silicon oxide. The gate insulating layer may have a single layer structure or a multi-layer structure, such as silicon oxide\silicon nitride. The active layer may be fabricated with amorphous silicon, low temperature polysilicon, organic polymer or semiconductor oxide. The protective layer may be fabricated with inorganic material such as silicon nitride, or organic material such as resin.

Figure 7:
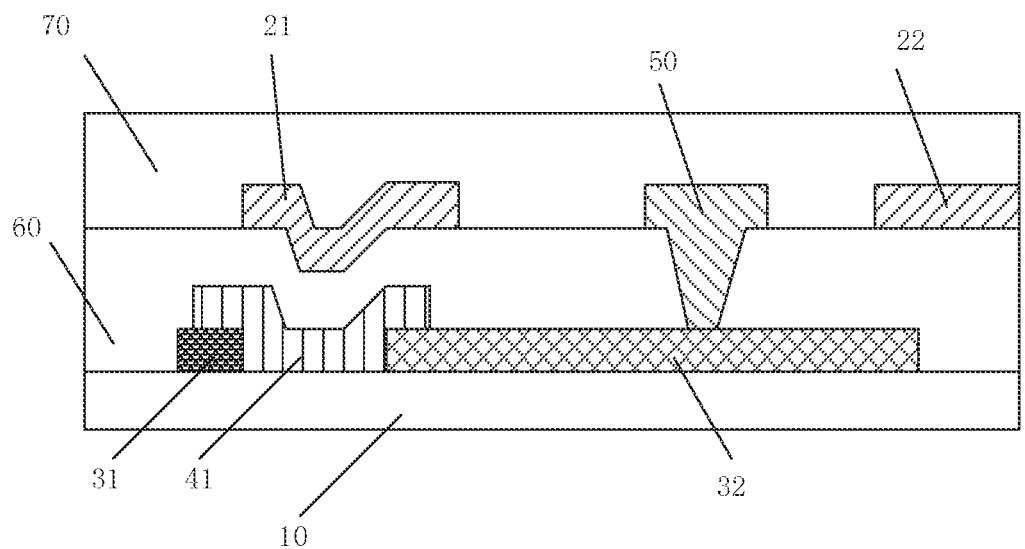
FIG. 7 is a cross sectional view showing a structure of an array substrate provided by another embodiment of the present disclosure.
Figure 8:
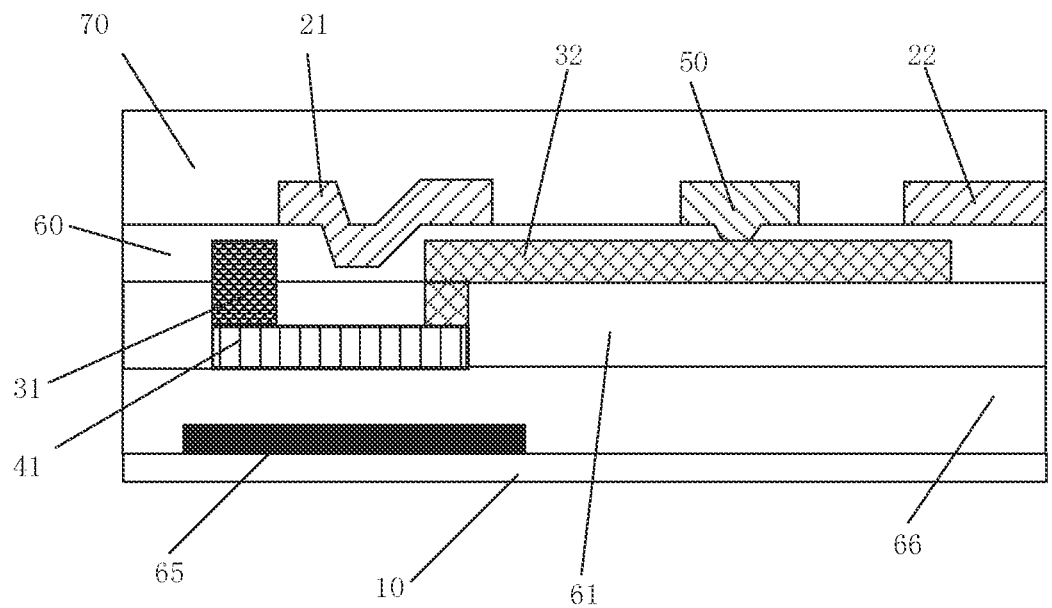
FIG. 8 is a cross sectional view showing a structure of an array substrate provided by another embodiment of the present disclosure.

It should be noted that the above embodiment is described with reference to the case where the TFT is located in the GOA region. However, the above embodiment may also be applied to the technical solution that the TFT is located in the ESD region, the pixel region, and the like. For example, the first electrically conductive layer of the TFT is connected to the scanning signal line of the pixel unit, the source electrode is connected to the data signal line, and the lead-out electrode is connected to the pixel electrode. The bottom gate electrode TFT (for example, FIG. 2) is described above as an example. However, of course, it may be applied to the TFT with other structures, such as a top gate electrode TFT, as shown in FIGS. 7 and 8. In the example shown in FIG. 7, the array substrate may include a base substrate 10, a source electrode 31, a drain electrode 32, an active layer 41, a gate insulating layer 60, a lead-out electrode 50, a gate electrode 21, a gate line 22, and a protective layer 70. For example, in FIG. 8, the array substrate may include a base substrate 10, a light shielding layer 65, a buffer layer 66, an active layer 41, a source electrode 31 and a drain electrode 32, an insulating layer 61, a gate insulating layer 60, a gate electrode 21, a lead-out electrode 50, a gate line 22 and a protective layer 70. Of course, other structures may also be included between various layers of the TFT. This structure is suitable for LCDs, OLEDs, electronic paper, etc. For example, the light shielding layer 65 may be disposed below or above the channel of the active layer to serve as a shield for light.

It should be noted that although the drain electrode having the extending portion and the electrode body has been described as an example in the above embodiment, it is appreciated that in the embodiments of the present disclosure, the drain electrode and the source electrode may be interchanged. For example, the above-described drain electrode having an extending portion and an electrode body may be replaced with a source electrode having an extending portion and an electrode body, or each of the source electrode and the drain electrode may have an extending portion and an electrode body.

Those skilled in the art should understand that the foregoing descriptions are merely specific embodiments of the present disclosure and are not intended to limit the present disclosure, and any modifications, equivalent replacements, and improvements made within the spirit and principle of the present disclosure should fall within the protection scope of the present disclosure.

The invention claimed is:

1. An array substrate comprising:
a base substrate; and
a first electrically conductive layer and a second electrically conductive layer on the base substrate,
wherein the base substrate is provided with at least one thin film transistor, each of the at least one thin film transistor comprises a gate electrode disposed in the first electrically conductive layer, and a source electrode and a drain electrode disposed in the second electrically conductive layer, and wherein the drain electrode has a comb shape and comprises a plurality of drain electrode sub-portions extending parallel to one another, and the source electrode has a comb shape and comprises a plurality of source electrode sub-portions extending parallel to one another,
wherein at least one of the drain electrode and the source electrode comprises an electrode body and an extending portion, the electrode body overlapping with the gate electrode, and the extending portion overlapping with a portion of the first electrically conductive layer other than the gate electrode, and
wherein the plurality of drain electrode sub-portions comprises a first drain electrode sub-portion and a second drain electrode sub-portion, the first drain electrode sub-portion comprises a first electrode body and a first extending portion, the second drain electrode sub-portion comprises a second electrode body and a second extending portion, each of the first electrode body and the second electrode body overlaps with the gate electrode, each of the first extending portion and the second extending portion overlaps with the portion of the first electrically conductive layer other than the gate electrode, and the first extending portion and the second extending portion extend in a same direction.

2. The array substrate according to claim 1, wherein the plurality of drain electrode sub-portions and the plurality of source electrode sub-portions are alternately arranged in a first direction parallel to the base substrate.

3. The array substrate according to claim 1, wherein the plurality of source electrode sub-portions comprise a first source electrode sub-portion, a second source electrode sub-portion, and a third source electrode sub-portion, the first source electrode sub-portion, the second source electrode sub-portion, and the third source electrode sub-portion overlap with the gate electrode and extend in the same direction as the first extending portion and the second extending portion.

4. The array substrate according to claim 3, wherein the drain electrode comprises a drain electrode connection part electrically connecting the plurality of drain electrode sub-portions, and the source electrode comprises a source electrode connection part electrically connecting the plurality of source electrode sub-portions.

5. The array substrate according to claim 4, wherein the drain electrode connection part is connected to the plurality of drain electrode sub-portions at a right angle.

6. The array substrate according to claim 4, wherein at least a portion of an orthogonal projection of the drain electrode connection part on the base substrate is located between an orthogonal projection of the gate electrode on the base substrate and an orthogonal projection of the portion of the first electrically conductive layer other than the gate electrode on the base substrate.

7. The array substrate according to claim 6, further comprising:
a lead-out electrode layer electrically connected to the drain electrode through a via hole, wherein an orthogonal projection of the via hole on the base substrate is located between the orthogonal projection of the gate electrode on the base substrate and the orthogonal projection of the portion of the first electrically conductive layer other than the gate electrode on the base substrate.

8. The array substrate according to claim 7, wherein the lead-out electrode layer extends in a same direction as the drain electrode connection part.

9. The array substrate according to claim 1, wherein the first electrically conductive layer further comprises a gate line connected to the gate electrode; and
wherein each of the first extending portion and the second extending portion overlaps with the gate line.

10. The array substrate according to claim 9, wherein the first extending portion and the first electrode body are in a same straight line and the first extending portion is perpendicular to the gate line; and the second extending portion and the second electrode body are in a same straight line and the second extending portion is perpendicular to the gate line.

11. The array substrate according to claim 1, wherein an area of a region where the first extending portion overlaps with the portion of the first electrically conductive layer other than the gate electrode is smaller than or equal to an area of a region where the first electrode body overlaps with the gate electrode; and an area of a region where the second extending portion overlaps with the portion of the first electrically conductive layer other than the gate electrode is smaller than or equal to an area of a region where the second electrode body overlaps with the gate electrode.

12. The array substrate according to claim 1, wherein a sum of an overlap capacitance between the first electrode body and the gate electrode and an overlap capacitance between the first extending portion and the portion of the first electrically conductive layer other than the gate electrode is a constant value; or a sum of an overlap capacitance between the second electrode body and the gate electrode and an overlap capacitance between the second extending portion and the portion of the first electrically conductive layer other than the gate electrode is a constant value.

13. A display device comprising the array substrate according to claim 1.

14. An array substrate comprising:
a base substrate; and
a first electrically conductive layer and a second electrically conductive layer on the base substrate,
wherein the base substrate is provided with at least one thin film transistor, each of the at least one thin film transistor comprises a gate electrode disposed in the first electrically conductive layer, and a source electrode and a drain electrode disposed in the second electrically conductive layer, the drain electrode comprises a first drain electrode sub-portion and a second drain electrode sub-portion extending parallel to each other and a drain electrode connection part electrically connecting the first drain electrode sub-portion and the second drain electrode sub-portion, the drain electrode connection part is disposed at a right angle to either of the first drain electrode sub-portion and the second drain electrode sub-portion, and
wherein at least one of the drain electrode and the source electrode comprises an electrode body and an extending portion, the electrode body overlapping with the gate electrode, the extending portion overlapping with a portion of the first electrically conductive layer other than the gate electrode, and the first drain electrode sub-portion is perpendicular to a gate line.

15. A display device comprising the array substrate according to claim 14.

16. An array substrate comprising:
a base substrate; and
a first electrically conductive layer and a second electrically conductive layer on the base substrate,
wherein the base substrate is provided with at least one thin film transistor, each of the at least one thin film transistor comprises a gate electrode disposed in the first electrically conductive layer, and a source electrode and a drain electrode disposed in the second electrically conductive layer;
wherein the first electrically conductive layer further comprises a gate line electrically connected to the gate electrode and at least one protrusion projecting from the gate line, the protrusion is separated from the gate electrode, and at least one of the drain electrode and the source electrode overlaps with each of the gate electrode and the protrusion,
wherein the protrusion and the gate electrode project from the gate line in a same direction, and a length by which the protrusion projects from the gate line is greater than a length by which the gate electrode projects from the gate line, and
wherein the array substrate further comprises: a lead-out electrode layer electrically connected to the drain electrode through a via hole, wherein an orthogonal projection of the via hole on the base substrate is located between an orthogonal projection of the gate electrode on the base substrate and an orthogonal projection of the protrusion on the base substrate.

17. The array substrate according to claim 16, wherein the drain electrode comprises a first drain electrode sub-portion and a second drain electrode sub-portion extending parallel to each other and a drain electrode connection part electrically connecting the first drain electrode sub-portion and the second drain electrode sub-portion, the drain electrode connection part extends in a same direction as the lead-out electrode layer.

18. A display device comprising the array substrate according to claim 16.

* * * * *